United States Patent [19]

Kausche et al.

[11] 4,245,386
[45] Jan. 20, 1981

[54] METHOD OF MANUFACTURING A SOLAR CELL BATTERY

[75] Inventors: Helmold Kausche; Gerhard Mayer; Karl-Ulrich Stein, all of Munich, Fed. Rep. of Germany

[73] Assignee: Siemens Aktiengesellschaft, Berlin & Munich, Fed. Rep. of Germany

[21] Appl. No.: 48,054

[22] Filed: Jun. 13, 1979

[30] Foreign Application Priority Data

Jun. 20, 1978 [DE] Fed. Rep. of Germany ....... 2827049

[51] Int. Cl.³ .......................................... H01L 31/04
[52] U.S. Cl. ...................... 29/572; 136/244; 427/74
[58] Field of Search ............ 136/89 P, 89 MS; 427/74; 29/572

[56] References Cited

U.S. PATENT DOCUMENTS

| | | | |
|---|---|---|---|
| 2,428,537 | 10/1947 | Veszi et al. | 136/89 |
| 3,483,038 | 12/1969 | Hui et al. | 136/89 |
| 3,620,847 | 11/1971 | Wise | 136/89 |
| 3,977,904 | 8/1976 | Köhler | 136/89 |
| 4,126,150 | 11/1978 | Bell et al. | 136/89 TF |
| 4,166,880 | 9/1979 | Loferski | 428/457 |

FOREIGN PATENT DOCUMENTS 1564935  10/1975  Fed. Rep. of Germany ............. 136/89

*Primary Examiner*—Aaron Weisstuch
*Attorney, Agent, or Firm*—Hill, Van Santen, Steadman, Chiara & Simpson

[57] ABSTRACT

Solar cells are constructed as a plurality of spaced strips formed along the length of synthetic foils. They are connected in series along their entire length in a simple manner. Therefore, the connections are formed by means of vapor-deposited metal layers and the solar cells lying next to one another are connected in series by means of vapor-deposited metal layers, whereby these vapor-deposited metal layers respectively connect the upper semiconductor layer or, respectively, a Schottky contact metal layer, as the case may be, of one solar cell with the lower metal layer of the neighboring solar cell. Sections of any desired length may be cut off from the elongated battery by cutting transversely to the length thereof. The series-connected sections thus formed may be employed without re-wiring.

15 Claims, 2 Drawing Figures

METHOD OF MANUFACTURING A SOLAR CELL BATTERY

INTRODUCTION

The present invention relates to a solar cell battery in which two or more solar cells are arranged on a synthetic foil in the form of strips which are parallel to one another, whereby, for the formation of the solar cells, these strips contain at least one first electrically conductive layer, an active zone arranged above it, and a second electrically conductive layer and in which the solar cells are connected in series.

BACKGROUND OF THE INVENTION

Solar cells constructed on synthetic foils are known from "L'onde electrique", 1975, Vol. 55, No. 2, pp. 21-24, whereby a first metal layer is manufactured by means of metallizing as a first electrically conductive layer. If such solar cells are to be connected in series, then external wiring is usually employed.

SUMMARY OF THE INVENTION

The object underlying the present invention is to provide a novel solar cell battery having particularly secure wiring and which is particularly simple to manufacture.

This object is achieved by having the first electrically conductive layers overlapped by the active zones to such a degree that one respective layer strip remains free; by having the active zones extend beyond the related first conductive layer to the synthetic foil on the side opposite the free layer strips; by having the related second conductive layers arranged overlapping or covering these active zones; by having these second conductive layers not cover the edges of the active zones which neighbor the free layer strips. The object is further achieved by having the second conductive layers respectively bridge the intermediate space between the covered active zone and the first conductive layer of the neighboring solar cell, by partially overlapping the free layer strip of this first conductive layer of the respectively neighboring solar cell, but by not touching the edge of the active zone of the neighboring solar cell, which edge limits the free layer strip.

By an active zone, what is meant here is a construction which consists of two semiconductor layers with a pn-junction there-between or a semiconductor layer and a Schottky contact, i.e., a metal layer arranged above it, whereby a barrier is formed between the two layers. The electrically conductive layers can consist of metal or of other electrically conductive substances. Because of their favorable light permeability, layers of In-Sn-oxide are advantageously employed insofar as they are to be permeated by light to be converted into electric energy. A thin insulation layer is advantageously arranged between the semiconductor layer and the metal layer forming the Schottky contact, which thin insulation layer is tunneled through by charge carriers, i.e., is permeated with a finite probability $<1$ because of its energy distribution.

The herein described construction has the advantage that the contacting is very safely designed, that the corresponding layers of the neighboring solar cells are electrically conductively connected with one another over their entire length; therefore, sections of any desired length can be cut off from the solar cell battery by cutting transversely to the length thereof and thus be employed without re-wiring the solar cells. The external wiring, too, can ensue at any desired location on the entire length of the first or, respectively, second conductive layer lying at the edge.

The active zone can advantageously be constructed of known semiconductor layers, in that a first, n-conductive semiconductor layer is arranged over the first metal layer and a second, p-conductive semiconductor layer is arranged over this n-conductive semiconductor layer (or vice versa) and in that the p-conductive semiconductor layer completely covers the n-conductive layer on the side lying opposite the free metal strip. The surface connection ensues via a comb-like backplate electrode in order to allow as much light as possible to pass through into the pn-junction. In another embodiment, the metal layer of a Schottky contact can be formed relatively thin and, thus, light-permeable, whereas a relatively thick, electrically conductive comb-like metal layer above it in the active zone provides for a good connection in the form of narrow bands and creates the connection to the neighboring cell outside of the active zone. Usually, a very thin ($\sim 4$ nm) insulation layer is also arranged between the semiconductor and Schottky contact layers for improvement of efficiency.

Aluminum is particularly well suited as the metal for the first and second metal layers; platinum, for example, is particularly well suited as the Schottky contact metal.

In order to improve the conductivity of the layer lying on top, it is to be recommended that the second metal layer overlap the active zone only in a narrow strip and that contact strips consisting of metal are connected electrically conductive with the second metal layer, which contact strips extend over the active zone. Advantageously, these contact strips are connected in one piece with the second metal layer. Depending on the conductivity of the layer lying on top, their interval is selected as large as possible in order to keep the undesired absorption of light in these contact strips small.

An advantageous method for manufacturing a solar cell battery according to the invention is provided by at least the first or the second metal layer of a solar cell battery being manufactured in one process step by means of vacuum metallization in a pass-through process. In such a process the strips proceed in the moving direction of the foil; the uncoated areas are generated in the usual manner by masking means, e.g., revolving tape-shaped screens. The required layers of the active zone are applied on the vapor-deposited metal strips preferably consisting of aluminum, said layers of the active zone being strip-shaped and displaced laterally with respect to the vapor-deposited metal strips. Given the employment of p- or, respectively, n-conductive silicon, the plasma-CVD process (chemical vapor deposition process) frequently employed in semiconductor technology or the cathode sputtering process can be utilized. Like the vapor-depositing of aluminum, these processes can likewise be employed in a pass-through manner.

In addition to this process, the method of applying an n-conductive layer and forming therein the desired p-conductive surface layer by means of ion implantation in a successive process step is to be recommended.

The second metal layer is again advantageously formed for example, by means of vacuum metallization of aluminum. Thus, a great number of solar cells can be manufactured in one process step and be connected in series. The contacting of the series of cells created in this manner ensues via the first or, respectively, second metal layer located at the respective edge. This can be strengthened in order to achieve a lower internal resistance.

All of these manufacturing steps can be carried out in only one vacuum system without breaking the vacuum between the individual layering processes. This is a further advantage for the efficient manufacture of the solar cell battery. The metal layers can be manufactured by means of vapor metallization or cathode sputtering; the semiconductor layers can be manufactured by cathode sputtering, CVD, or plasma-CVD processes. If different deposition processes, which require different pressures are employed, the system is constructed of a plurality of chambers, if need be with pressure stages.

The invention is explained in greater detail on the basis of two Figures.

DESCRIPTION OF THE PREFERRED EMBODIMENTS

Figure 1:
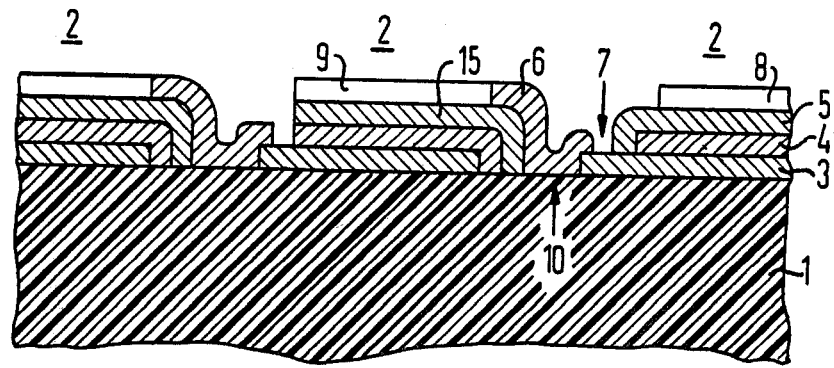
FIG. 1 is a sectional view of a portion of a preferred embodiment of the present invention.

Referring first to FIG. 1, solar cell strips 2 are arranged on an insulative carrier foil 1. These solar cell strips 2 consist of a first metallization 3, a first n-conductive semiconductor layer 4, a second p-conductive semiconductor layer 5 or, respectively, 15, and a second metal layer 6. The semiconductor layers 4 and 5 or, respectively, 15, form the active zone. The second metal layer 6 overlaps the second semiconductor layer 15 only in its edge area. This overlapped edge area can lie completely outside of the overlapping with the first semiconductor layer 4. Here in FIG. 1, it is laid comb-like over the layer 5 or, respectively, over layer 15. The metal layer 6 extends over the intermediate space 10 between the second semiconductor layer 15 of a first solar cell strip 2 and the first metal layer 3 of a second solar cell strip 2, whereby the metal layer 3 is not completely covered by the two semiconductor layers 4 and 15, so that a metal strip 7 free of the active zone 4 and 5 or, respectively, 15, remains. This free metal strip 7 is partially overlapped by the second metal layer 6. However, the metal layer 6 touches none of the semiconductor layers 4 or 5 or, respectively, 15 of the rightwardly adjacent solar cell strip.

Figure 2:
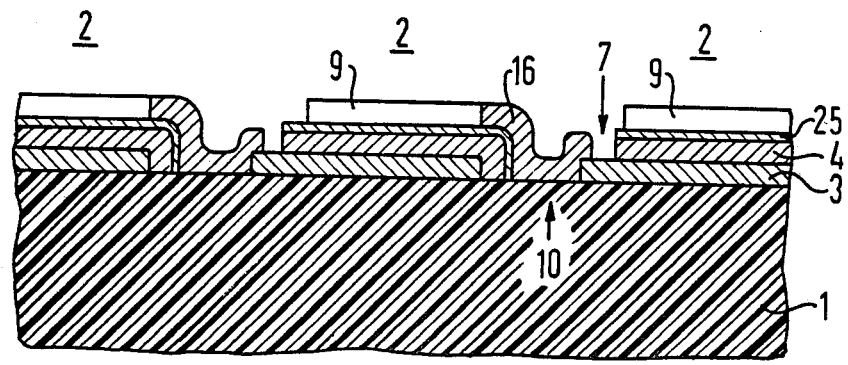
FIG. 2 is a sectional view of a portion of another preferred embodiment of the present invention.

Referring now to FIG. 2, solar cell strips 2 are arranged on an insulative carrier foil 1. These solar cell strips 2 consist of a first metallization 3, a first semiconductor layer 4, a thin second metal layer 25 consisting, for example, of Pt which forms a Schottky contact to semiconductor layer 4. The second metal layer 25 leaves free the left side edge of the semiconductor layer 4, and thus does not cover it completely. The semiconductor layer 4 and the thin metal layer 25 form the active zone. The third metal layer 16 overlaps the second metal layer 25 over its entire length but only in its right side edge area. This overlapped edge area can lie completely outside of the overlapping with the first semiconductor layer 4. Here, in FIG. 2, it is laid comb-like over the layer 25. The third metal layer 16 extends over the intermediate space 10 between the second metal layer 25 of a first solar cell strip 2 and the first metal layer of an adjacent solar cell strip 2, whereby the metal layer 3 is not completely covered by the semiconductor layer 4 and the metal layer 25, so that a metal strip 7 free of the active zone remains. This free metal strip 7 is partially overlapped by the second metal layer 16.

Moreover, for increasing the open-circuit voltage of the solar cells and, thus, for improving the efficiency, a very thin insulation layer which is approximately 4 nm thick and can be tunneled through by charge carriers can be arranged between the semiconductor layer 4 and the Schottky contact layer 25.

The metal layers 3 and 6 or, respectively, 16 preferably consist of aluminum or aluminum alloys which are usual in semiconductor technology. Polyimide or polyethylene terephthalate are particularly suited for the carrier foil 1.

The illustrated embodiments shown in the examples are suitable for light, incident from above, first striking the second semiconductor layer 5 or 15 or the Schottky contact layer 25. If light incident from below through the carrier foil 1 is to be converted into electrical energy, then it is necessary that the carrier foil 1 exhibit no absorption insofar as possible in the wavelength range of the light which is to be converted into electric energy by the semiconductor arrangement. In this case, the first metal layers 3 are formed so thin that the light can beam through them. Mainly, however, conductive, transparent layers such as In-Sn-oxide layers are employed. In this case, moreover, it is advantageous that the first electrically conductive layers 3 consisting of metal not be formed continuously, but rather that strip-shaped interruptions of the metal layer be provided at least in the area covered by the semiconductor layers. These, for example, can proceed comb-like from the free layer strips 7. Upon impingement of light from above, i.e., through the second semiconductor layer 5 or 15 as well as the Schottky contact layer 25, it is likewise advantageous for increasing the conductivity to place metal strips 8 or 9 proceeding from an electrically conductive layer 6 to overly the second semiconductor layer 5 or 15, or, respectively, the Schottky contact layer 25.

The second semiconductor layer 5, insofar as it is of high-resistance or, respectively, only becomes conductive upon the incidence of light (photoconduction), may cover the first semiconductor layer 4 and contact the first electrically conductive layer 3. Given a high-resistance design of the second semiconductor layer 5, the shunt which hereby arises does not lead to a significant loss of energy. However, the metal strips 8 or 9 may under no condition touch the electrically conductive layer 3 of the same solar cell. When the second semiconductor layer 5 comes into contact with the first electrically conductive layer 3, it is to be recommended that the metal strips 8 not reach the edge of the first semiconductor layer 4, so that a low-resistance connection to the electrically conductive layer 3 is avoided. If the second semiconductor layer 15 does not contact the electrically conductive layer 3, then a greater internal resistance of the solar cell 2 ensues when the metal strips 9 reach the edge of the second electrically conductive layer 15.

Amorphous silicon layers ~1 nm thick doped with hydrogen can serve as semiconductor layers 4, 5, 15.

It will be apparent to those skilled in the art that many modifications and variations may be effected without departing from the spirit and scope of the novel concepts of the present invention.

We claim as our invention:

1. A method of manufacturing solar cell batteries, comprising the steps of:

moving an elongate insulating strip in its longitudinal direction;

vapor depositing a first plurality of spaced elongate aluminum strips onto the insulating strip continuously parallel to the direction of movement of said insulating strip;

applying active zones comprising at least one layer of doped semiconductor material on the first aluminum strips offset to leave uncovered portions of the strips continuously parallel to the direction of movement of said insulating strip;

vapor depositing a second plurality of spaced elongate aluminum strips continuously parallel to the direction of movement of said insulating strip so that each of said second aluminum strips contacts an active zone and contacts the uncovered portion of the adjacent first aluminum strip, whereby a plurality of elongate series-connected solar cells are formed extending in the longitudinal direction; and cutting through the series-connected solar cells transverse to said longitudinal direction at random locations to thereby segment said series-connected solar cells, whereby a plurality of series-connected solar batteries are formed from the segments.

2. The method of claim 1, wherein the step of applying active zones is further defined as:

depositing a layer of n-conductive material and then a layer of p-conductive material by a plasma chemical deposition process.

3. The method of claim 1, wherein the step of applying active zones is further defined as:

vapor depositing a layer of doped semiconductor material on the first aluminum strips; and vapor depositing a light-permeable platinum layer on the doped layer of semiconductor material as a Schottky contact.

4. The method of claim 3, wherein the step of applying active zones is further defined as:

applying an insulating layer on the layer of semiconductor material prior to vapor depositing the platinum layer.

5. A method of manufacturing solar cell batteries, comprising the steps of:

moving an elongate insulating strip in its longitudinal direction;

applying a first plurality of spaced elongate electrically conductive strips onto the insulating strip continuously parallel to the direction of movement of said insulating strip;

applying active zones comprising at least one layer of doped semiconductor material on the first metal strips offset to leave uncovered portions of the strips continuously parallel to the direction of movement of said insulating strip;

applying a second plurality of spaced elongate electrically conductive strips continuously parallel to the direction of movement of said insulating strip so that each of said second electrically conductive strips contacts an active zone and contacts the uncovered portion of the adjacent first electrically conductive strip, whereby a plurality of elongate series-connected solar cells are formed extending in the longitudinal direction; and cutting through the series-connected solar cells transverse to the longitudinal direction at random locations to thereby segment said series-connected solar cells, whereby a plurality of series-connected solar batteries are formed from the segments.

6. The method of claim 5, wherein the step of moving an elongate insulating strip is further defined as:

moving an elongate polyimide strip in its longitudinal direction.

7. The method of claim 5, wherein the step of moving an elongate insulating strip is further defined as:

moving an elongate polyethylene terephthalate strip in its longitudinal direction.

8. The method of claim 5, wherein the step of applying a first plurality of electrically conductive strips is further defined as:

applying a first plurality of elongate indium-tin oxide strips.

9. The method of claim 5, wherein the step of applying a first plurality of electrically conductive strips is further defined as:

applying each of the first electrically conductive strips in the shape of a comb to contact and also leave open areas beneath the active zones.

10. The method of claim 5, wherein the step of applying active zones is further defined as:

applying an n-conductive semiconductor layer onto said first electrically conductive strips; and implanting ions at the surface of said n-conductive semiconductor layer to grow a p-conductive semiconductor layer.

11. The method of claim 5, wherein the steps of applying the first and second pluralities of electrically conductive layers are further defined as:

cathode sputtering the electrically conductive layers onto the insulating layer and active zones, respectively.

12. The method of claim 5, wherein the step of applying the active zones is further defined as:

cathode sputtering the layer of doped semiconductor material onto the first electrically conductive strips.

13. The method of claim 5, wherein the step of applying the active zones is further defined as:

depositing the doped semiconductor material by chemical vapor deposition.

14. The method of claim 5, wherein the step of applying the active zones is further defined as:

depositing the doped semiconductor material by plasma chemical vapor deposition.

15. The method of claim 5, wherein the step of applying active zones is further defined as:

vapor depositing a layer of doped semiconductor material on the first electrically conductive strips; and vapor depositing a light-permeable platinum layer on the doped layer of semiconductor material as a Schottky contact.

* * * * *